(12) United States Patent
Lee

(10) Patent No.: US 6,392,475 B1
(45) Date of Patent: May 21, 2002

(54) OFFSET COMPENSATION APPARATUS IN A DIFFERENTIAL AMPLIFIER CIRCUIT AND OFFSET COMPENSATION METHOD THEREOF

(75) Inventor: Don-Woo Lee, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/783,586

(22) Filed: Feb. 15, 2001

(30) Foreign Application Priority Data

Aug. 18, 2000 (KR) ......................................... 2000-47964

(51) Int. Cl.$^7$ ................................................ H03F 1/02
(52) U.S. Cl. .............................. 330/9; 330/69; 327/124
(58) Field of Search ....................... 330/9, 69; 327/124, 327/307

(56) References Cited

U.S. PATENT DOCUMENTS

| | | | | |
|---|---|---|---|---|
| 4,276,513 A | * | 6/1981 | Johnston et al. ............... | 330/9 |
| 4,306,196 A | * | 12/1981 | Dwarakanath et al. .......... | 330/9 |
| 4,580,103 A | * | 4/1986 | Tompsett ........................ | 330/9 |
| 4,651,110 A | * | 3/1987 | Lechner et al. ................. | 330/9 |
| 6,049,246 A | | 4/2000 | Kozisek et al. ................. | 330/9 |

* cited by examiner

*Primary Examiner*—Robert Pascal
*Assistant Examiner*—Henry Choe
(74) *Attorney, Agent, or Firm*—Fleshner & Kim, LLP

(57) ABSTRACT

The present invention relates to an offset compensation apparatus in a differential amplifier circuit and an offset compensation method thereof that can compensate an offset in a differential amplifier circuit separately for each input signal. The offset compensation device preferably selectively couples a capacitor to an input of a differential amplifier to store an offset voltage. The offset compensation method preferably can operate by detecting an offset of the differential amplifier circuit, by storing the offset, by directly inputting the result of compensating the offset voltage for an input voltage into the differential amplifier and by outputting the output voltage corresponding to the input voltage without the offset voltage included. The differential amplifier circuit and the offset compensation method can further include an additional output stage coupled to a load.

19 Claims, 13 Drawing Sheets

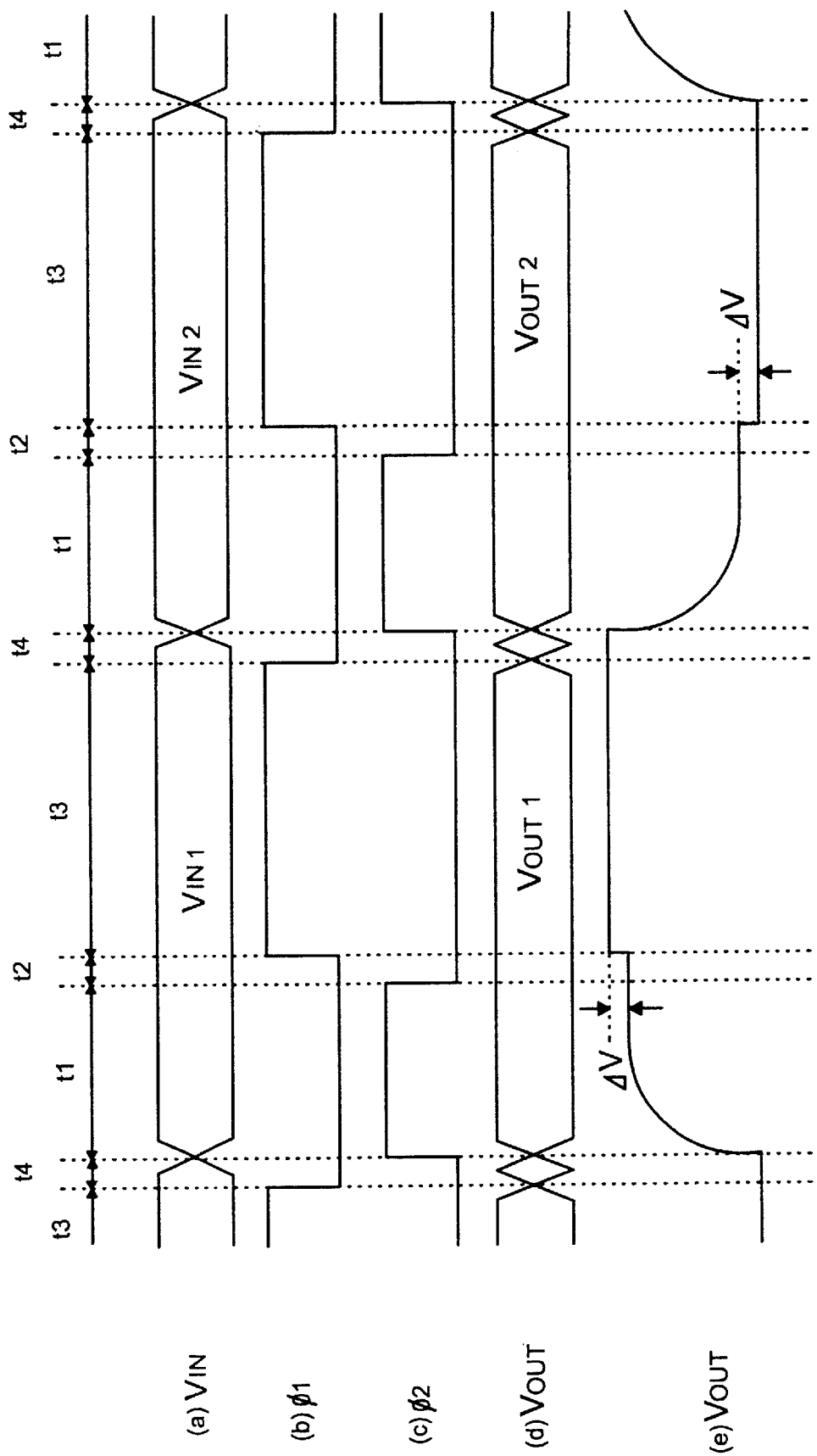

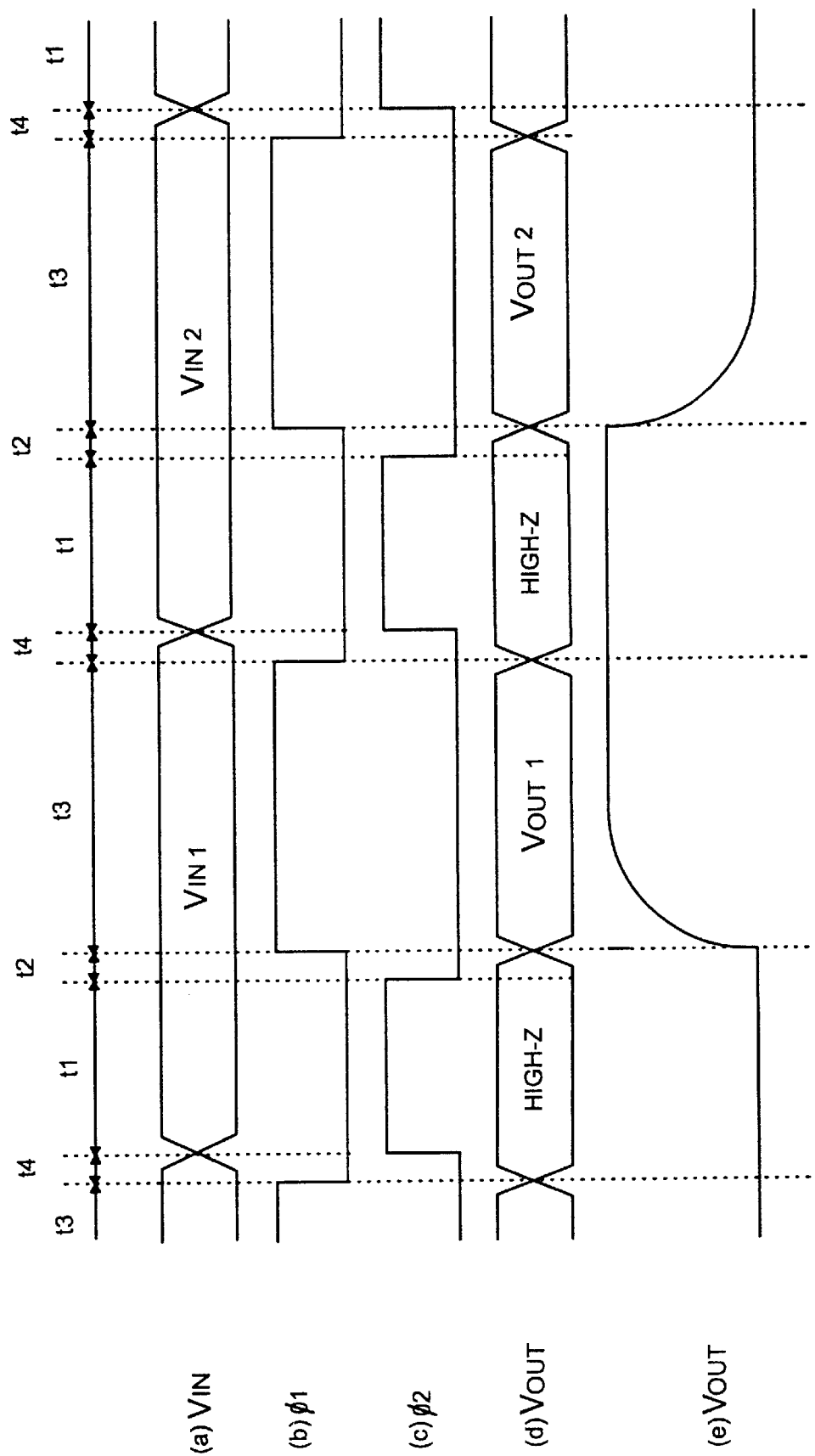

OFFSET COMPENSATION APPARATUS IN A DIFFERENTIAL AMPLIFIER CIRCUIT AND OFFSET COMPENSATION METHOD THEREOF

BACKGROUND OF THE INVENTION

1. Field of the Invention

The present invention relates to a semiconductor integration circuit, and in particular, to a differential amplifier circuit.

2. Background of the Related Art

A differential amplifier includes a non-inversion input terminal, an inversion terminal and an output terminal generating an output voltage in accordance with a differential input voltage. The differential amplifiers are used in applied fields for various purposes, one of which is a buffer. One differential amplifier used as a buffer is termed a 'voltage follower'. In this buffer, an input signal is inputted to a non-inversion input terminal of the differential amplifier, and an output signal is fed back to an inversion input terminal of the differential amplifier.

FIG. 1 is a diagram that shows a related art differential amplifier circuit, which is an offset cancellation circuit of an amplifier disclosed by U.S. Pat. No. 6,049,246 (AMPLIFIER OFFSET CANCELLATION USING CURRENT COPIER). As shown in FIG. 1, the related art offset cancellation circuit detects an offset current using a current copier circuit connected to an output terminal. Then, an offset voltage is cancelled by compensating the offset voltage from an output voltage generated from a differential input voltage.

The offset cancellation circuit shown in FIG. 1 includes a current copier circuit in an output stage of a differential amplifier to detect and compensate an offset. The related art current copier circuit carries out an offset voltage detection once and stores the result. Then, the current copier circuit executes an offset compensation by applying the detected offset voltage to all output signals.

In FIG. 1, an operational transconductance amplifier (OTA) 20 is shown having input terminals 22 and 24 and output terminal 26 coupled to output node 46. A feedback path extends between output node 46 and negative input terminal 24. A first switch 56 extends between positive input terminal 22 and negative input terminal 24 for selectively shorting such input terminals together in order to null any input differential voltage thereacross. A second switch 58 is inserted within the aforementioned feedback path for selectively opening or closing the feedback path that couples output node 46 back to negative input terminal 24 of the OTA 20. When switch 58 is closed, as shown in FIG. 1, the OTA 20 operates in closed-loop fashion; when switch 58 is opened the OTA 20 operates in open-loop fashion.

As shown in FIG. 1, a current copier circuit is conceptually represented by current source 60, transistor 62, and storage capacitor 64. The current copier circuit has a first terminal 66 for selectively allowing storage capacitor 64 to be connected to the output node 46 of the OTA 20. The current copier circuit also includes a second terminal 68 coupled to the output node 46, and to the output terminal 26 of the OTA 20. The function of this current copier circuit is to "supply" an offset current having a magnitude that is equal and opposite to the output offset current of OTA 20. As used herein, the term "supply" could mean either sourcing current or sinking current. As shown in FIG. 1, a third switch 70 is provided for selectively coupling the first terminal 66 of the current copier circuit to the output node 46 of the OTA 20, thereby allowing the current copier circuit to respond to the voltage present on the output node 46. The current source 60 sources a fixed amount of current. The transistor 62 can be biased to sink an amount of current that is either greater than, equal to, or less than, the amount of current source by the current source 60.

As described above, the related art differential amplifier offset cancellation circuit has various disadvantages. As the magnitude of input signal of a differential amplifier varies so does that of the offset voltage included in the output voltage. Thus, the related art differential amplifier offset cancellation circuit is unable to accomplish a precise offset compensation because the identical offset voltage is applied to all of the output signals for offset compensation. Further, the offset cancellation circuit according to the related art uses a current source for detection and compensation of an offset voltage, which consumes current unnecessary for offset detection and compensation modes.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide an offset compensation apparatus in a differential amplifier circuit and an offset compensation method thereof that substantially obviates one or more of the problems caused by limitations and disadvantages of the related art.

Another object of the present invention is to provide an offset compensation apparatus in a differential amplifier circuit and an offset compensation method thereof that compensates an offset in a differential amplifier circuit by coupling a non-inversion input terminal of a differential amplifier circuit to a storage device.

Another object of the present invention is to provide an offset compensation apparatus in a differential amplifier circuit and an offset compensation method thereof that compensates an offset in a differential amplifier circuit by coupling a non-inversion input terminal of a differential amplifier circuit to a storage device to store an offset voltage for each input signal.

Another object of the present invention is to provide an offset compensation apparatus in a differential amplifier circuit and an offset compensation method thereof that compensates an offset in a differential amplifier circuit by coupling a non-inversion input terminal of a differential amplifier circuit to a capacitor that stores an offset voltage, which is determined by detecting an offset of the differential amplifier circuit, storing the offset in the capacitor and by inputting the result of compensating the offset voltage for an input voltage into the differential amplifier.

To achieve at least the object and other advantages in a whole or in part and in accordance with the purpose of the present invention, as embodied and broadly described, the present invention of an offset compensation apparatus in a differential amplifier circuit that drives a load includes an input stage that receives an input voltage, a differential amplifier that includes a non-inversion input terminal, an inversion input terminal and an output stage, wherein the non-inversion and inversion input terminals receive a differential input voltage and the output stage generates an output voltage in accordance with the differential input voltage, a capacitor coupled to the non-inversion input terminal, a first switch coupled between the input stage and the capacitor, wherein the first switch is controlled by a first control signal and selectively couples the input stage to the capacitor, a second switch coupled between the input stage and the non-inversion input terminal, wherein the second switch is controlled by a second control signal and selectively couples the input stage to the non-inversion input terminal, and a third switch coupled between the output stage and the capacitor, wherein the third switch is controlled by the second control signal and selectively couples the output stage to the capacitor.

To further achieve the above objects in a whole or in part, an offset compensation method in a differential amplifier circuit is provided, wherein the amplifier circuit includes an input stage that receives an input voltage, a differential amplifier having a non-inversion input terminal, an inversion input terminal and a first output stage, wherein the non-inversion and inversion input terminals receive a differential input voltage and the first output stage generates a first output voltage in accordance with the differential input voltage, a storage device coupled to the non-inversion input terminal, a first input path selectively formed between the input stage and the storage device, a second input path selectively formed between the input stage and the non-inversion input terminal, a first feed-back path between the first output stage and the inversion input terminal, and a second feed-back path selectively formed between the first output stage and the storage device the offset compensation method that includes receiving the input voltage, forming the second input path and the first and second feed-back paths to output the first output voltage that results from adding an offset voltage of the differential amplifier to the input voltage, and storing an offset voltage that is a voltage difference between the first output voltage and the input voltage in the storage device, forming the first feed-back path and maintaining a voltage level of the first output voltage, forming the first input path and the first feed-back path to input a voltage to the non-inversion input terminal that results from cancellation of the offset voltage from the input voltage by transferring the input voltage to the storage device through the first input path and outputting the output voltage equal to the input voltage by adding an offset voltage of the differential amplifier to the voltage that results by cancellation of the offset voltage from the input voltage, and forming the first feed-back path and maintaining the voltage level of the first output voltage.

To further achieve the above objects in a whole or in part, a differential amplifier circuit according to the present invention is provided that an input stage that receives an input voltage, a differential amplifier that has a non-inversion input terminal, an inversion input terminal and a first output stage, wherein the non-inversion and inversion input terminals receive a differential input voltage and the first output stage generates a first output voltage in accordance with the differential input voltage, a second output stage for connection to a load, wherein the second output stage generates a second output voltage, a storage device coupled to the non-inversion input terminal, a first switch coupled between the input stage and the storage device, wherein the first switch is controlled by a first control signal and selectively transfers the input voltage to the storage device, a second switch coupled between the input stage and the non-inversion input terminal, wherein the second switch is controlled by a second control signal and selectively transfers the input voltage to the non-inversion input terminal, a third switch coupled between the first output stage and the storage device, wherein the third switch is controlled by the second control signal and selectively transfers the first output voltage to the storage device, and a fourth switch coupled between the first output stage and the second output stage, wherein the fourth switch is controlled by the first control signal and selectively generates the second output voltage by selectively coupling the first output stage to the load.

To further achieve the above objects in a whole or in part, an offset compensation method in a differential amplifier circuit for driving a load, wherein an amplifier includes an input stage to receive an input voltage, a differential amplifier having a non-inversion input terminal, an inversion input terminal and a first output stage wherein the non-inversion and inversion input terminals receive a differential input voltage and the first output stage generates a first output voltage in accordance with the differential input voltage, a second output stage connected to a load and generating a second output voltage, a storing circuit connected to the non-inversion input terminal, a first input path formed selectively between the input stage and the storing circuit wherein the first input path transfers the input voltage to the storing circuit, a second input path formed selectively between the input stage and the non-inversion input terminal wherein the first input path transfers the input voltage to the non-inversion input terminal directly, a first feed-back path formed between the output stage and the inversion input terminal wherein the first feed-back path transfers the output voltage to the inversion input terminal, a second feed-back path formed selectively between the output stage and the storing circuit wherein the second feed-back path transfers the output voltage to the storing circuit, an output path formed between the first and second output stages selectively and transferring the first output voltage to the load, includes forming the second input path and the first and second feed-back paths, outputting the first output voltage resulted by adding an offset voltage of the differential amplifier to the input voltage, and storing an offset voltage which is a voltage difference between the first output voltage and the input voltage in the storing circuit, forming the first feed-back path, and maintaining a level of the first output voltage, forming the first input, first feed-back and output paths, inputting a voltage which is resulted by cancelling the offset voltage from the input voltage by transferring the input voltage to the storing circuit through the first input path, to the non-inversion input terminal, outputting the first output voltage equal to the input voltage by adding an offset voltage of the differential amplifier to the voltage which is resulted by cancelling the offset voltage from the input voltage, and outputting the second output voltage by transferring the first output voltage to the second output stage, and forming the first feed-back path, and maintaining a voltage level of the output voltage.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 is a graph showing a timing diagram and waveforms illustrating operational characteristics of an offset compensation apparatus of a differential amplifier circuit according to a preferred embodiment of the present invention;

FIG. 5 is a graph showing timing diagram and waveforms illustrating operational characteristics of an offset compensation apparatus of a differential amplifier circuit according to another preferred embodiment of the present invention.

DETAILED DESCRIPTION OF PREFERRED EMBODIMENTS

Figure 1:
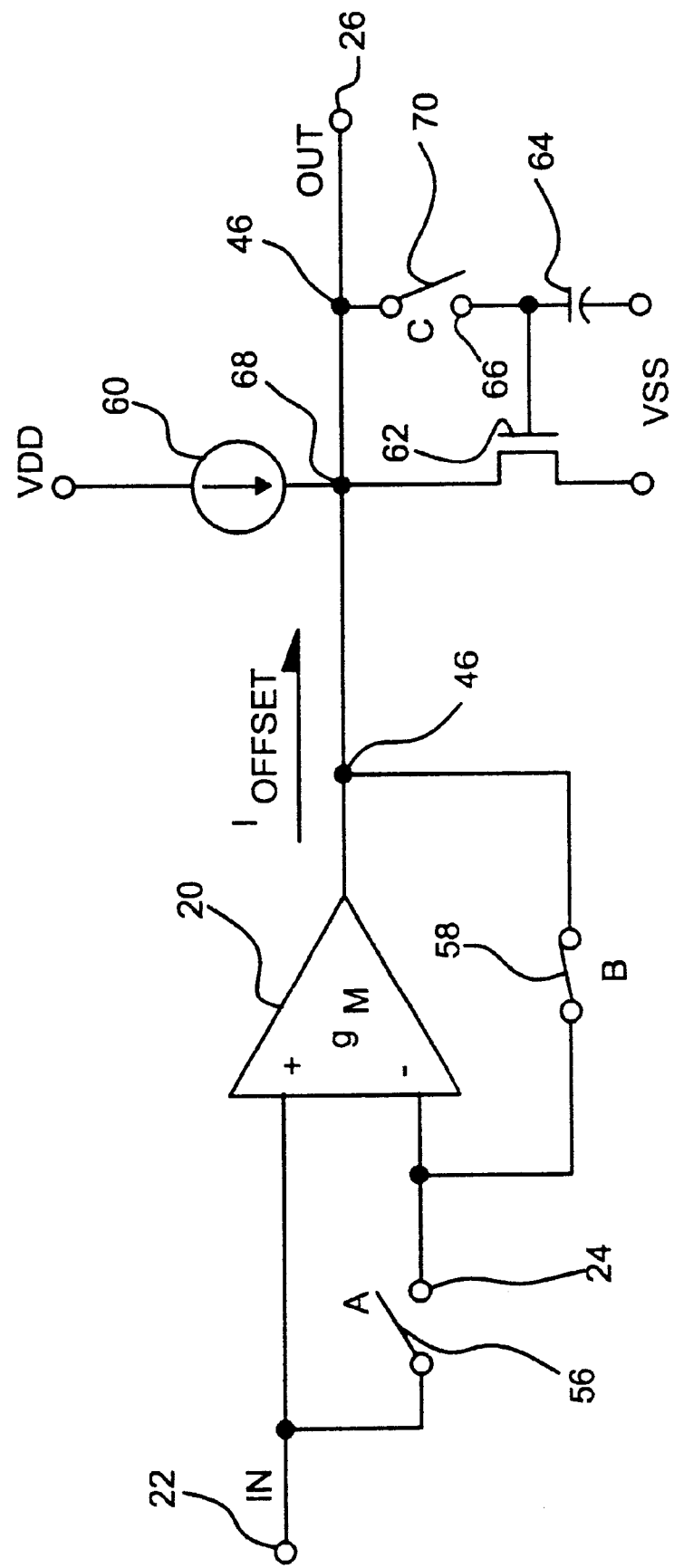
FIG. 1 is a diagram that shows a related art differential amplifier circuit.
Figure 2A:
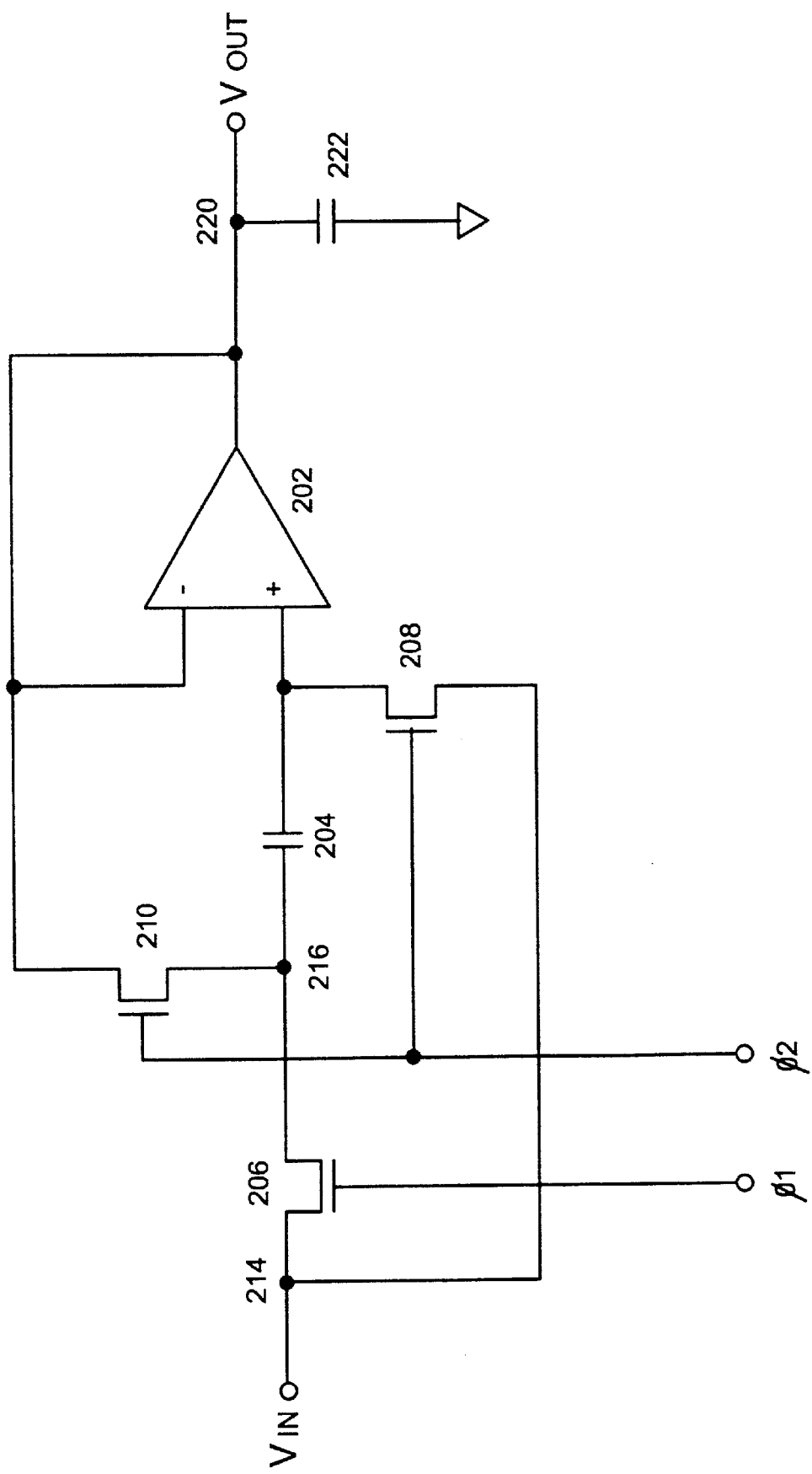
FIGS. 2A–2E are diagrams that show an offset compensation apparatus of a differential amplifier circuit according to a preferred embodiment of the present invention.

FIGS. 2A–2E are diagrams that show an offset compensation apparatus of a differential amplifier circuit and equivalent circuits according to a first preferred embodiment of the present invention. As shown in FIG. 2A, a differential amplifier 202 includes a non-inversion input terminal +, an inversion terminal − and an output stage 220 that generates an output voltage $V_{OUT}$ in accordance with a differential input voltage. An input voltage $V_{IN}$ is inputted to an input stage 214. A capacitor 204, which is a storage device is coupled to the non-inversion input terminal +. An NMOS transistor 206 as a first switch is coupled between the input stage 214 and the capacitor 206. The NMOS transistor 206, which is controlled by a first control signal that is preferably a first clock signal φ1, transfers the input voltage $V_{IN}$ to the capacitor 204 by coupling the input stage 214 to the capacitor 204 selectively.

An NMOS transistor 208 as a second switch is coupled between the input stage 214 and the non-inversion input terminal +. The NMOS transistor 208, which is controlled by a second control signal that is preferably a second clock signal φ2, inputs the input voltage $V_{IN}$ directly into the non-inversion input terminal + by coupling the input stage 214 to the non-inversion input stage + selectively.

An NMOS transistor 210 as a third switch is coupled between the output stage 220 and the capacitor 204. The NMOS transistor 210, which is controlled by the second clock signal φ2, feeds back the output voltage $V_{OUT}$ to the capacitor 204 by coupling the output stage 220 to the capacitor selectively.

FIG. 3 is a diagram that shows a graph of timing diagram and waveforms illustrating operational characteristics of an offset compensation apparatus of a differential amplifier circuit according to the first preferred embodiment of the present invention. As shown in FIG. 3, graphs (a) to (d) are timing diagrams respectively illustrating an input voltage $V_{IN}$, a first clock signal φ1, a second clock signal φ2, and an output voltage $V_{OUT}$. A graph (e) shows a waveform of the output voltage $V_{OUT}$.

A first preferred embodiment of an offset compensation apparatus of a differential amplifier according to the present invention carries out offset detection and compensation in accordance with a period that includes intervals t1–t4 of the clocks signals φ1 and φ2 as shown in FIG. 3. An offset compensation by the offset compensation apparatus of a differential amplifier circuit according to the first preferred embodiment of the present invention will now be described by referring to FIG. 2A and FIG. 3.

In the interval t1, as the first and second clock signals φ1 and φ2 are low level and high level, respectively, the NMOS transistor 206 of FIG. 2A becomes turned off but the NMOS transistors 208 and 210 become enabled. Thus, the circuit shown in FIG. 2A can be represented by the equivalent circuit shown in FIG. 2B in the interval t1.

Figure 2B:
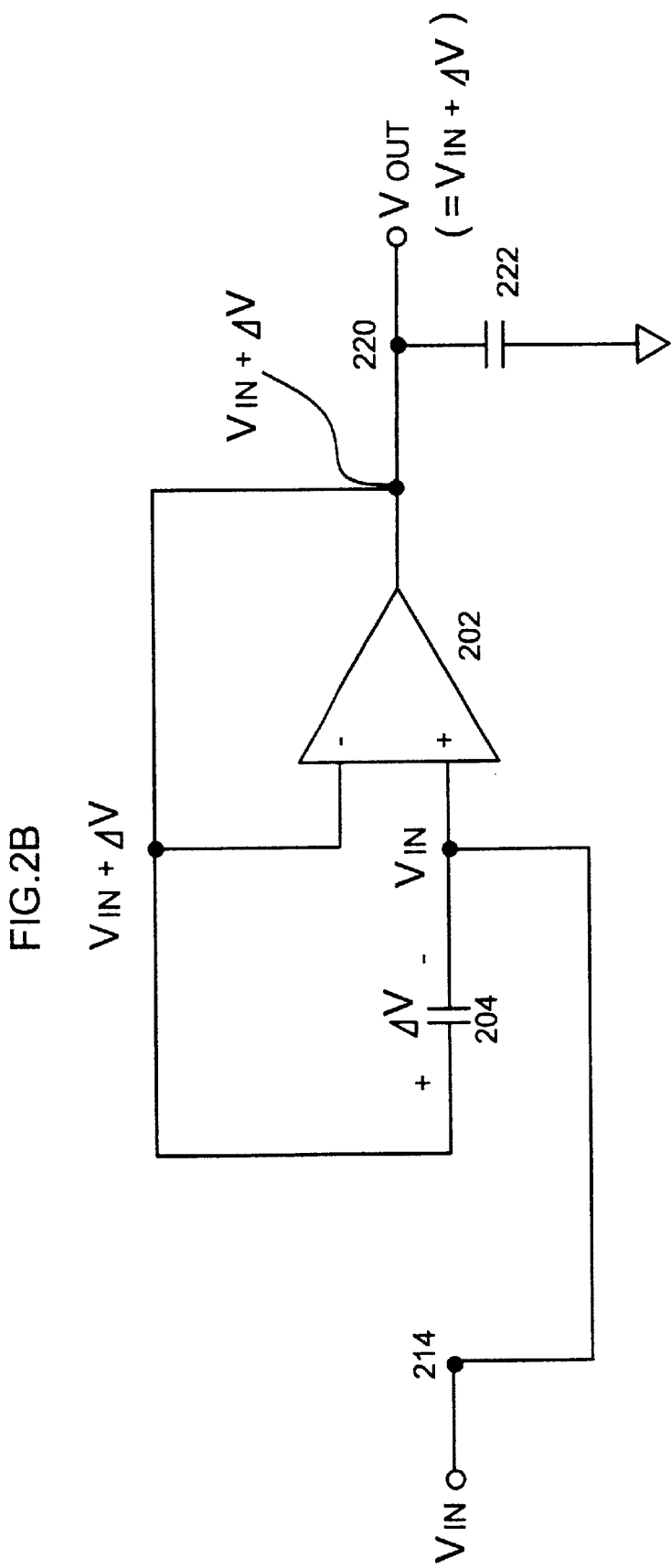

As shown in FIG. 2B, the input voltage $V_{IN}$ is directly inputted to the non-inversion input terminal + of the differential amplifier 202. The output voltage $V_{OUT}$ of the differential amplifier 202 is fed back to the capacitor 204. In this case, the output voltage $V_{OUT}$ of the differential amplifier 202 amounts to '$V_{IN}+\Delta V$', which results by adding an offset voltage $\Delta V$ of the differential amplifier 202 to the input voltage $V_{IN}$. Thus, the offset voltage $\Delta V$ that is a voltage difference between the input voltage $V_{IN}$ and the output voltage $V_{OUT}$ is stored in the capacitor 204.

Figure 2C:
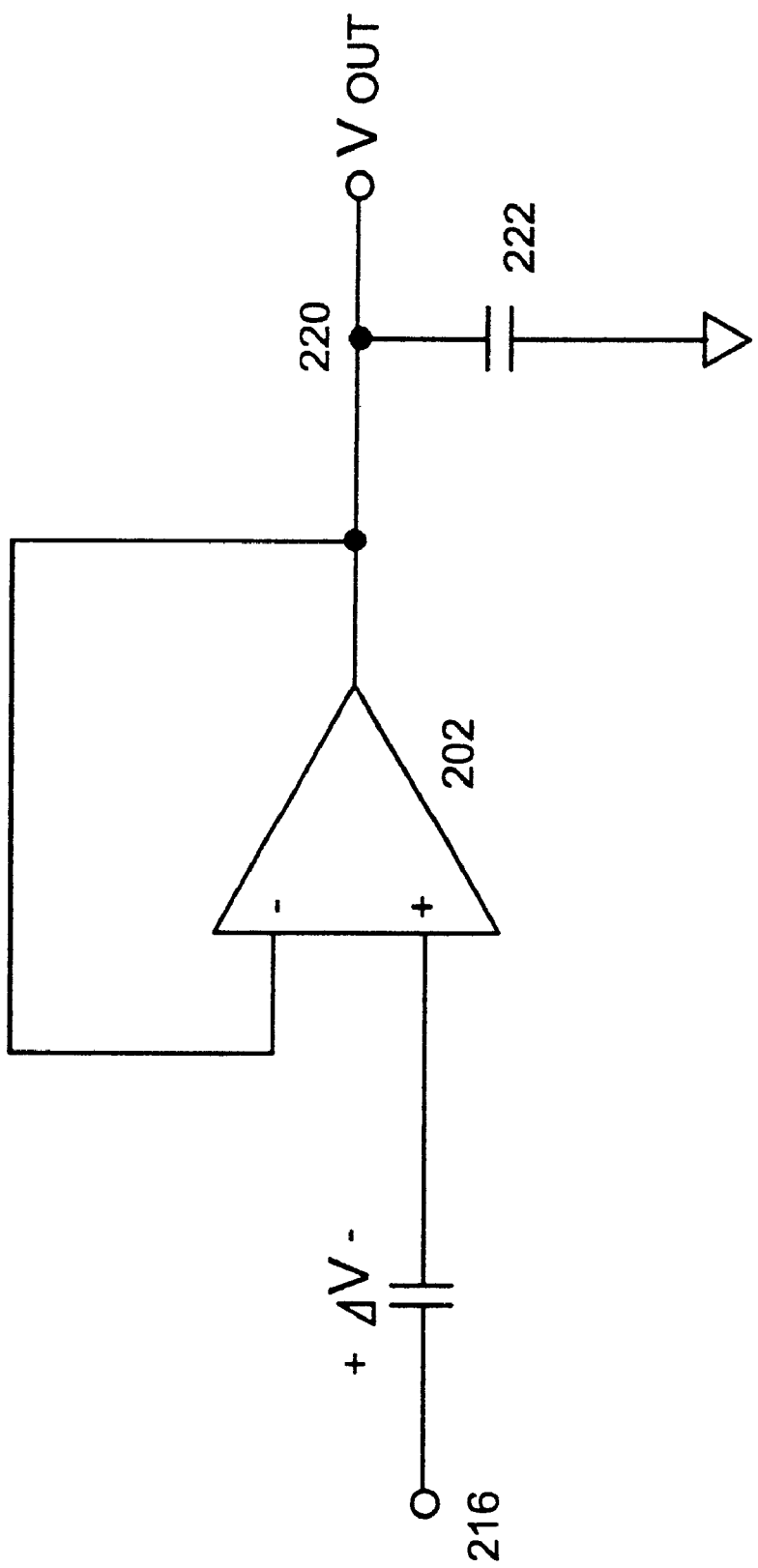

In the interval t2, as both the first and second clock signals φ1 and φ2 are low level, three NMOS transistors 206, 208 and 210 in FIG. 2A become turned off. Thus, the circuit shown in FIG. 2A can be represented by the equivalent circuit shown in FIG. 2C in the interval t2. As shown in FIG. 2C, the offset voltage $\Delta V$ still remains in the capacitor 204 during the interval t2 since the input voltage $V_{IN}$ and the output voltage $V_{OUT}$ have not been transferred.

Figure 2D:
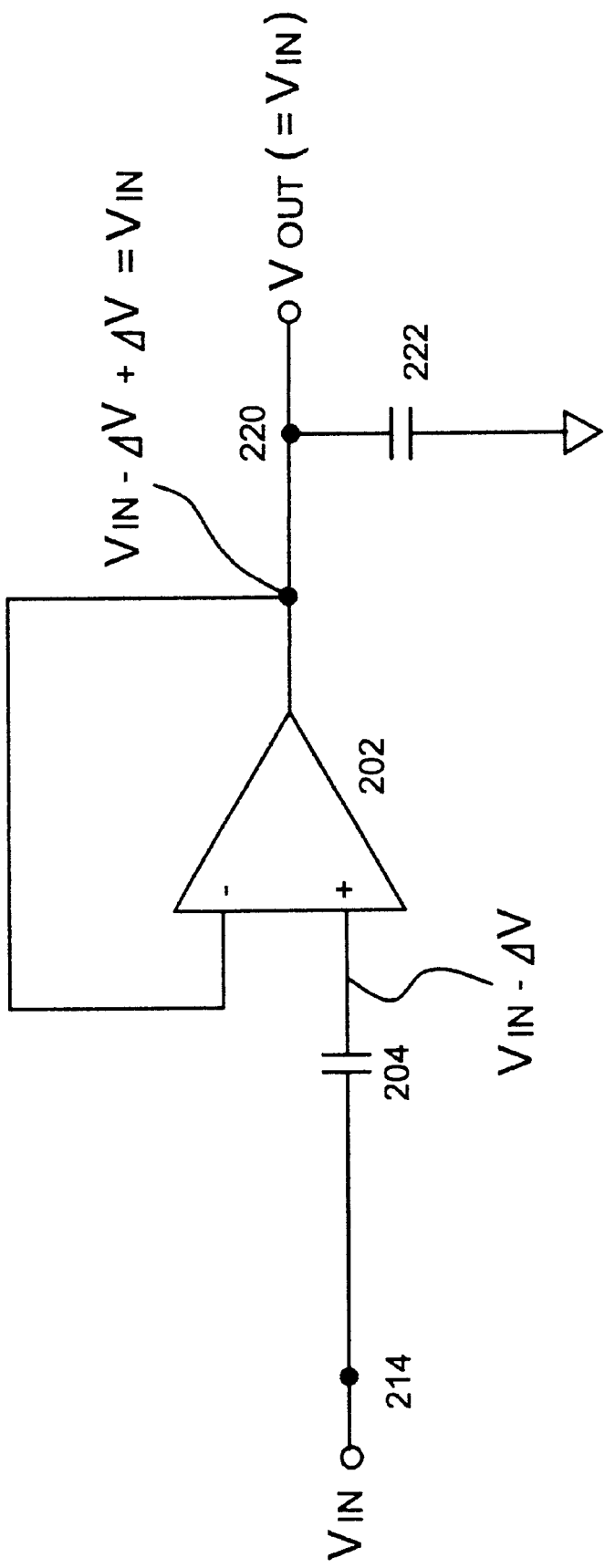

In the interval t3, as the first and second clock signals φ1 and φ2 are high level and low level, respectively, the NMOS transistor 206 becomes turned on but other NMOS transistors 208 and 210 become disabled. Thus, the circuit shown in FIG. 2A can be represented by the equivalent circuit shown in FIG. 2D in the interval t3. The output voltage $V_{OUT}$ of the differential amplifier 202 is fed back to the inversion input terminal −, as shown in FIG. 2D. The capacitor 204 is coupled to the input stage 214.

As a polarity of the input voltage $V_{IN}$ is opposite to that of the offset voltage $\Delta V$ stored in the capacitor 204, a non-inversion input voltage inputted to the non-inversion input terminal + of the differential amplifier is the result $V_{IN}-\Delta V$ of cancelling the offset voltage $\Delta V$ from the input voltage $V_{IN}$. As the output voltage $V_{OUT}$ of the differential amplifier 202 is the result of adding the offset voltage $\Delta V$ of the differential amplifier 202 to the non-inversion input voltage, the output voltage $V_{OUT}$ in the interval t3 is $V_{IN}-\Delta V+\Delta V=V_{IN}$. Thus, the magnitude of the output voltage $V_{OUT}$ in the interval t3 is equal to that of the input voltage $V_{IN}$, which means that the offset of the differential amplifier 202 that is included in the output voltage V is compensated.

Figure 2E:
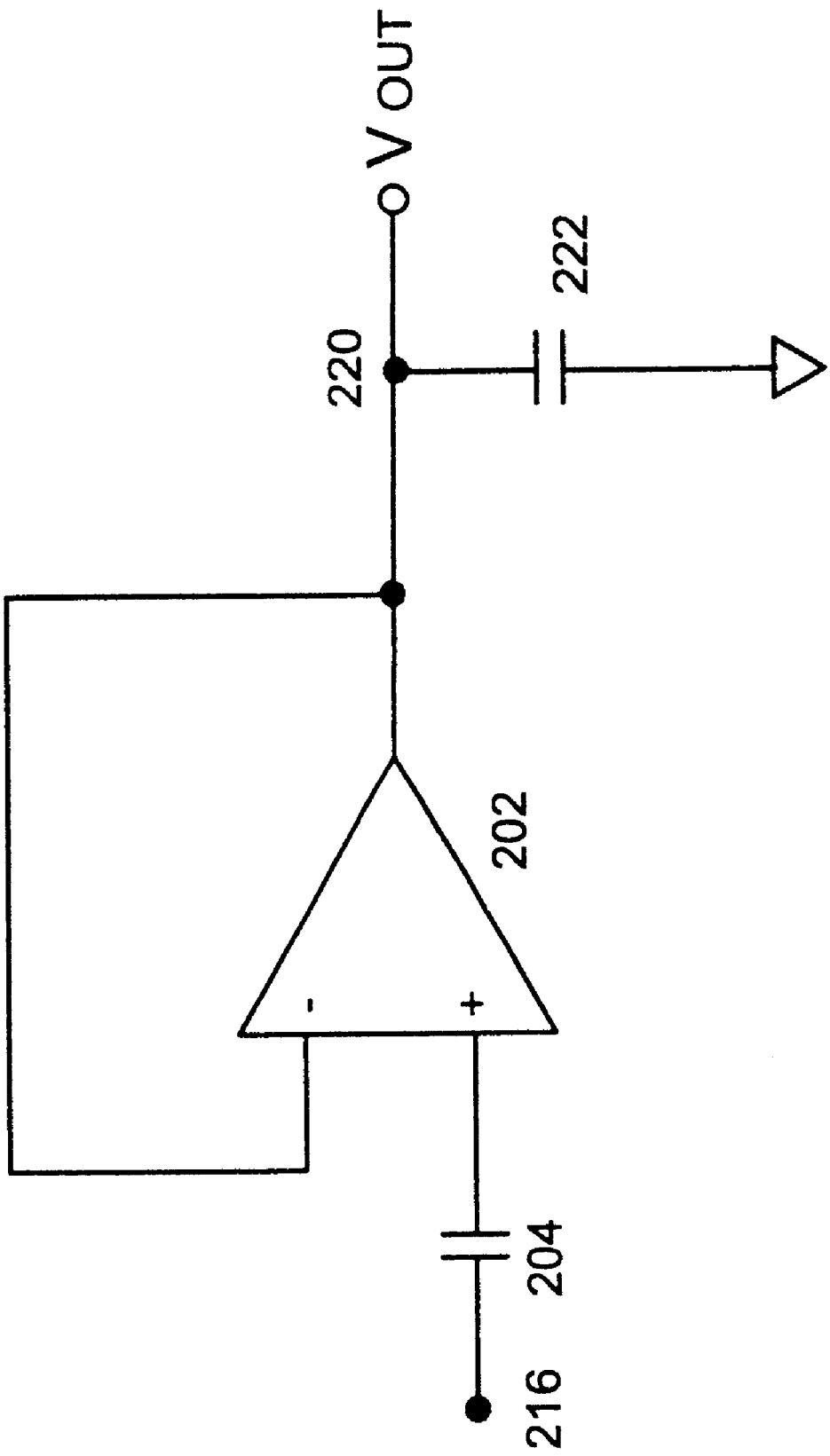

In the interval t4, as both the first and second clock signals φ1 and φ2 are low level, the three NMOS transistors 206, 208 and 210 in FIG. 2A become turned off. Thus, the circuit shown in FIG. 2A can be represented by the equivalent circuit shown in FIG. 2E in the interval t4. As shown in FIG. 2E, there is no new input voltage $V_{IN}$ of the differential amplifier 202 in the interval t4. Therefore, the present output voltage $V_{OUT}$ maintains its magnitude.

In a next series of intervals t1 through t4, the above-mentioned offset detection and compensation is preferably repeated against a new input voltage $V_{IN}$.

The offset compensation apparatus according to the first preferred embodiment of the present invention preferably generates an output voltage that has not been compensated in an offset detection mode, and then generates the offset voltage in which the offset has been compensated in a compensation mode. Thus, a first preferred embodiment of the offset compensator according to the present invention improves operational speed by driving the output stage initially, and then by transferring the compensated output voltage to a load immediately after the completion of offset compensation.

FIGS. 4A–4E are diagrams that show an offset compensation apparatus of a differential amplifier circuit and equivalent circuits according to a second preferred embodiment of the present invention. As shown in FIG. 4, a differential amplifier 402 includes a non-inversion input terminal +, an inversion terminal − and a first output stage 418 that generates a first output voltage $V_{418}$ in accordance with a differential input voltage.

An input voltage $V_{IN}$ is inputted to an input stage 414. A second output stage 420 that generates a second output voltage $V_{OUT}$ is coupled to a load 422. A capacitor 404 is coupled to the non-inversion input terminal +. An NMOS transistor 406 as a first switch is coupled between the input stage 414 and the capacitor 404. The NMOS transistor 406, which is controlled by a first control signal that is preferably a first clock signal $\phi1$, transfers the input voltage $V_{IN}$ to the capacitor 404 by selectively coupling the input stage 414 to the capacitor 404.

An NMOS transistor 408 as a second switch is coupled between the input stage 414 and the non-inversion input terminal +. The NMOS transistor 408, which is controlled by a second control signal that is preferably a second clock signal $\phi2$, inputs the input voltage $V_{IN}$ directly into the non-inversion input terminal + by selectively coupling the input stage 414 to the non-inversion input stage +.

An NMOS transistor 410 as a third switch is coupled between the first output stage 418 and the capacitor 404. The NMOS transistor 410, which is controlled by the second clock signal $\phi2$, feeds back the first output voltage $V_{418}$ to the capacitor 404 by selectively coupling the first output stage 418 to the capacitor 404. An NMOS transistor 412 as a fourth switch is coupled between the first output stage 418 and the load 422. The NMOS transistor 412, which is preferably controlled by the first clock signal $\phi1$, generates a second output voltage $V_{OUT}$ from the first output voltage $V_{418}$ by selectively coupling the first output stage 418 to the load 422.

FIG. 5 is a diagram that shows a graph of timing diagram and waveforms illustrating operational characteristics of an offset compensation apparatus of a differential amplifier circuit according to the second preferred embodiment of the present invention. As shown in FIG. 5, graphs (a) to (d) are timing diagrams respectively illustrating an input voltage $V_{IN}$, a first clock signal $\phi1$, a second clock signal $\phi2$, and an output voltage $V_{OUT}$. A graph (e) shows a waveform of the output voltage $V_{OUT}$.

A second preferred embodiment of an offset compensation apparatus of a differential amplifier according to the present invention carries out offset detection and compensation in accordance with a period that includes intervals t1–t4 of the clocks signals $\phi1$ and $\phi2$ as shown in FIG. 5. An offset compensation by the second preferred embodiment of the offset compensation apparatus of a differential amplifier circuit according to the present invention will now be described by referring to FIG. 4A and FIG. 5.

Figure 4A:
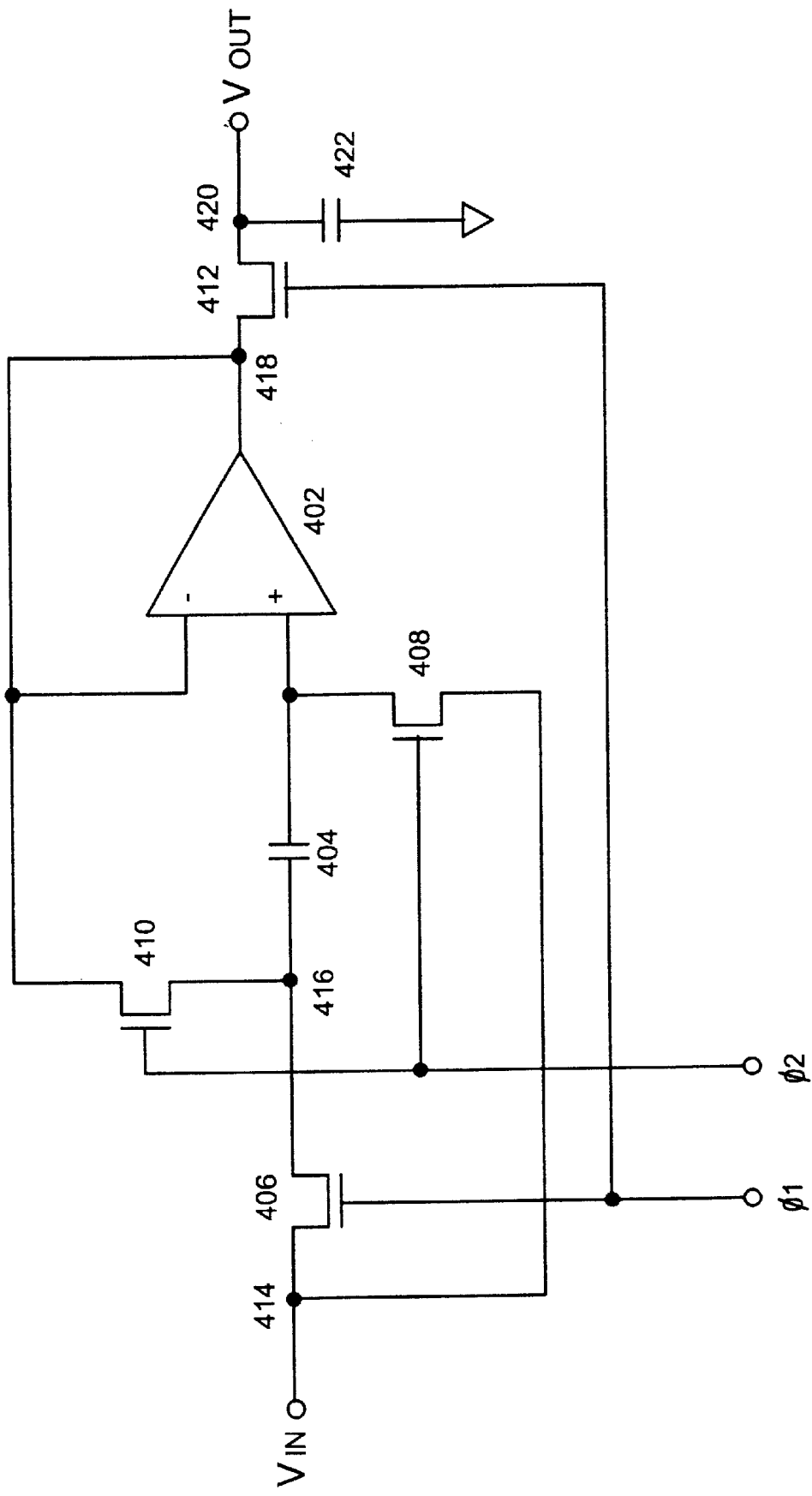
FIGS. 4A–4E are diagrams that show an offset compensation apparatus of a differential amplifier circuit according to another preferred embodiment of the present invention.

In the interval t1, as the first and second clock signals $\phi1$ and $\phi2$ are low level and high level, respectively, the NMOS transistors 406 and 412 of FIG. 4A become turned off but the NMOS transistors 408 and 410 become enabled. Thus, the circuit shown in FIG. 4A can be represented by the equivalent circuit shown in FIG. 4B in the interval t1.

Figure 4B:
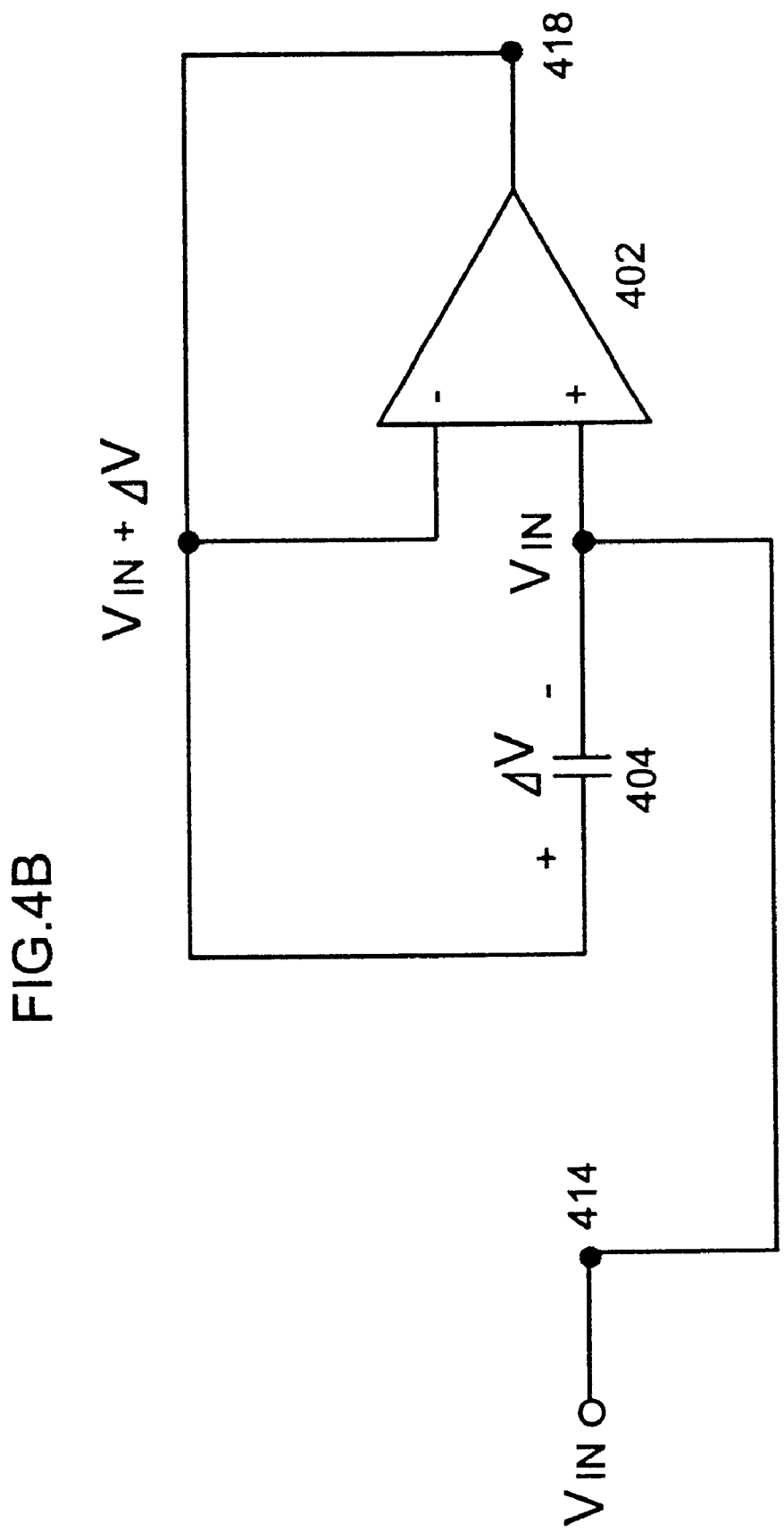

As shown in FIG. 4B, the input voltage $V_{IN}$ is directly inputted to the non-inversion input terminal + of the differential amplifier 402. The first output voltage $V_{418}$ of the differential amplifier 402 is fed back to the capacitor 404. In this case, the first output voltage $V_{418}$ of the differential amplifier 402 amounts to '$V_{IN}+\Delta V$', which results by adding an offset voltage $\Delta V$ of the differential amplifier 402 to the input voltage $V_{IN}$. Thus, the offset voltage $\Delta V$, which is a voltage difference between the input voltage $V_{IN}$ and the first output voltage $V_{418}$, is stored in the capacitor 404. As the NMOS transistor 412 coupled to the load 422 is turned off, the second output stage 420 is open to become a high impedance state.

Figure 4C:
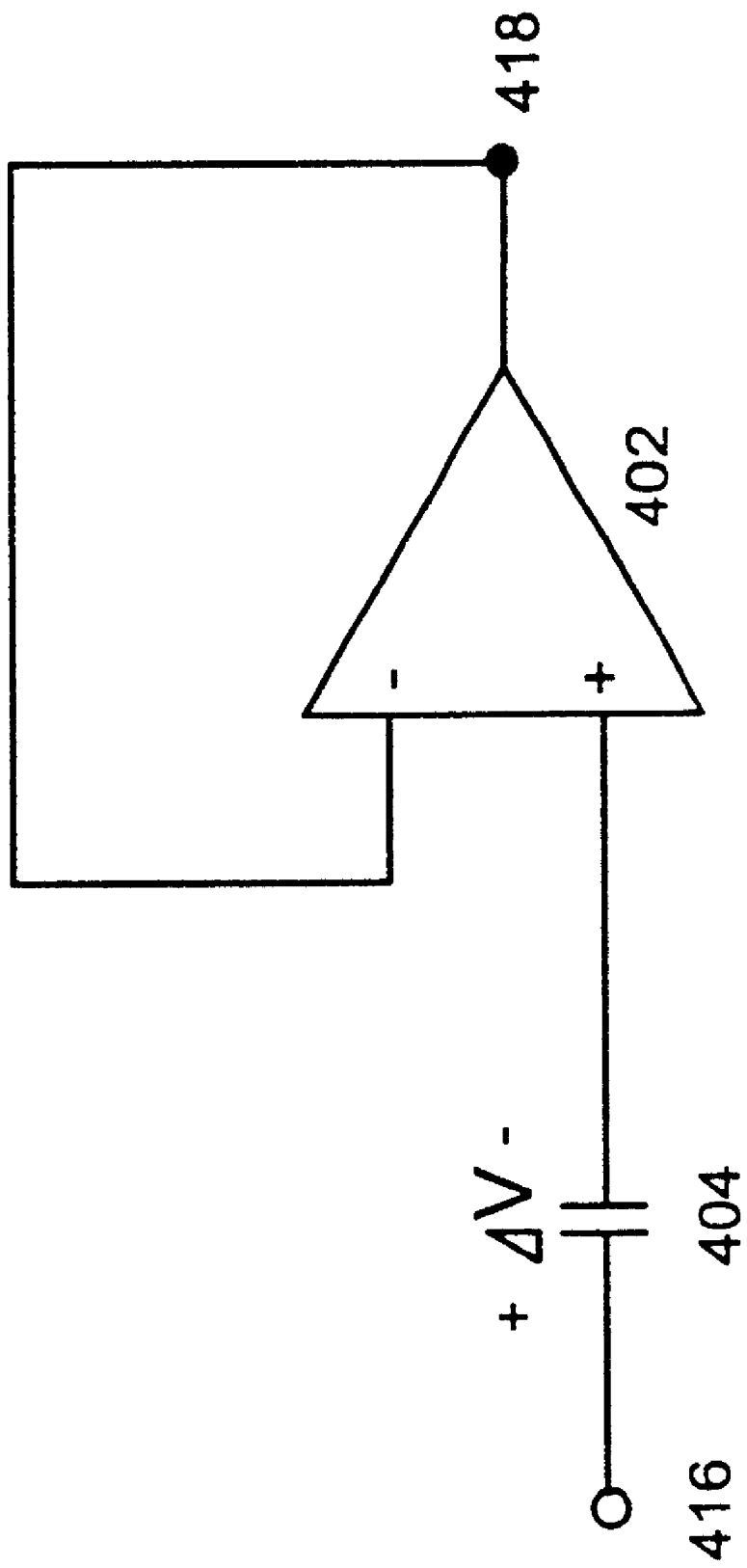

In the interval t2, as both the first and second clock signals $\phi1$ and $\phi2$ are low level, the four NMOS transistors 406, 408, 410 and 412 in FIG. 4A become turned off. Thus, the circuit shown in FIG. 4A can be represented by the equivalent circuit shown in FIG. 4C in the interval t2. As shown in FIG. 4C, the offset voltage $\Delta V$ still remains in the capacitor 404 during the interval t2 since the input voltage $V_{IN}$ and the output voltage $V_{OUT}$ have not been transferred.

Figure 4D:
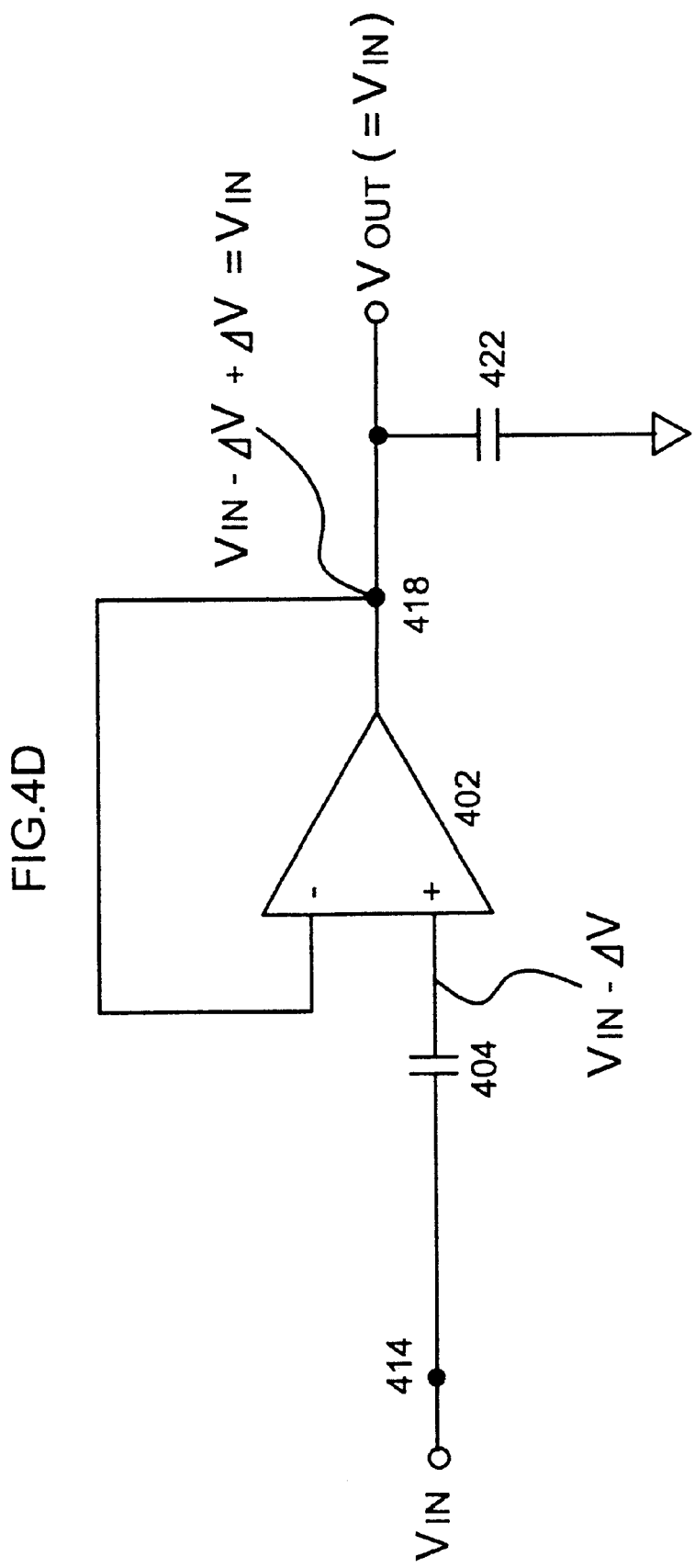

In the interval t3, as the first and second clock signals $\phi1$ and $\phi2$ are high level and low level, respectively, the NMOS transistors 406 and 412 become turned on but the NMOS transistors 408 and 410 become disabled. Thus, the circuit shown in FIG. 4A can be represented by the equivalent circuit shown in FIG. 4D in the interval t3. The first output voltage $V_{418}$ of the differential amplifier 402 is fed back to the inversion input terminal − as shown in FIG. 4D. The capacitor 404 is coupled to the input stage 414.

As a polarity of the input voltage $V_{IN}$ is opposite to that of the offset voltage $\Delta V$ stored in the capacitor 404, a non-inversion input voltage of the differential amplifier 402 is the result $V_{IN}-\Delta V$ for cancelling the offset voltage $\Delta V$ from the input voltage $V_{IN}$. As the first output voltage $V_{418}$ of the differential amplifier 402 is the result of adding the offset voltage $\Delta V$ of the differential amplifier 402 to the non-inversion input voltage, the first output voltage $V_{418}$ in the interval t3 is $V_{IN}-\Delta V+\Delta V=V_{IN}$. The second output voltage $V_{OUT}$ is generated since the first output stage 418 is coupled to the second output stage 420 in the interval t3. In this case, the magnitude of the second output voltage $V_{OUT}$ in the interval t3 is equal to that of the input voltage $V_{IN}$ because the offset of the differential amplifier 402 that is included in the second output voltage $V_{OUT}$ is compensated (e.g., cancelled).

Figure 4E:
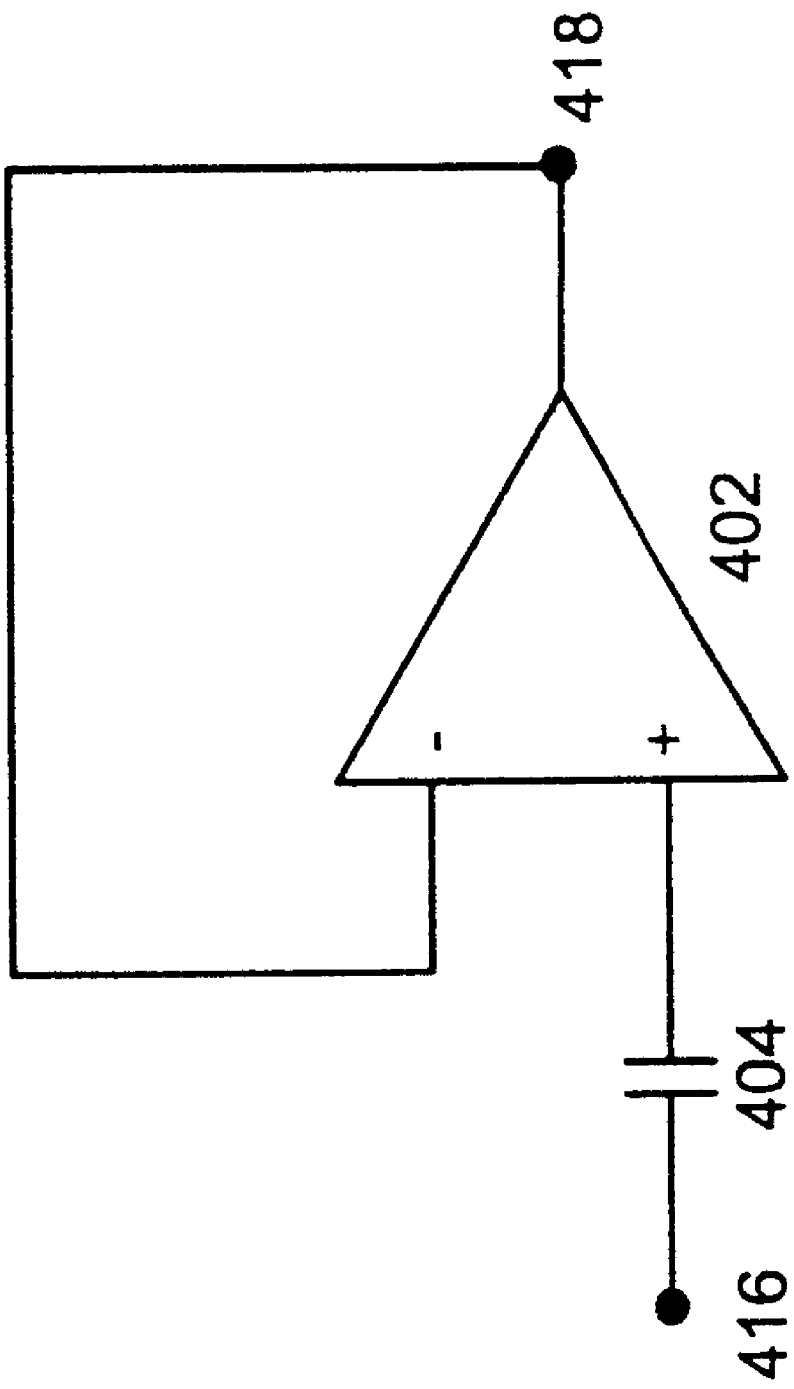

In the interval t4, as both the first and second clock signals $\phi1$ and $\phi2$ are low level, the four NMOS transistors 406, 408, 410 and 412 in FIG. 4A become turned off. Thus, the circuit shown in FIG. 4A can be represented by the equivalent circuit shown in FIG. 4E in the interval t4. As shown in FIG. 4E, there is no new input voltage $V_{IN}$ of the differential amplifier 402 in the interval t4. Therefore, the present first output voltage $V_{OUT}$ maintains its magnitude.

In the subsequent series of intervals t1 through t4, the above-described offset detection and compensation is preferably repeated against a new input voltage $V_{IN}$ in the second preferred embodiment.

The offset compensation apparatus according to the second preferred embodiment of the present invention generates no output at an offset detection mode, which is different from the first preferred embodiment. Thus, the second preferred embodiment of the offset compensation apparatus can be used for the case that requires a definite level of an output voltage $V_{OUT}$ to be transferred to the load.

As described above, preferred embodiments of an offset compensator and methods of using same have various advantages. Preferred embodiments of an offset compensator using an amplifier and methods for using same according to the present invention enable compensation of a random offset generated from a process mismatch as well as an accurate offset compensation that is carried out by detecting the respective offset values for every signal input. Further, the preferred embodiments enable chip size to be reduced, compared to that of the related art, since offset detection and compensation can be accomplished by coupling a storage device such as a capacitor to a non-inversion input terminal.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An offset compensator in a differential amplifier circuit for driving a load, comprising:
    an input stage that receives an input voltage;
    a differential amplifier that includes a non-inversion input terminal, an inversion input terminal and an output stage, wherein the non-inversion and inversion input terminals receive a differential input voltage and the output stage generates an output voltage in accordance with the differential input voltage;
    a capacitor coupled to the non-inversion input terminal;
    a first switch coupled between the input stage and the capacitor, wherein the first switch is controlled by a first control signal and selectively couples the input stage to the capacitor;
    a second switch coupled between the input stage and the non-inversion input terminal, wherein the second switch is controlled by a second control signal and selectively couples the input stage to the non-inversion input terminal; and
    a third switch coupled between the output stage and the capacitor, wherein the third switch is controlled by the second control signal and selectively couples the output stage to the capacitor, wherein offset detection and compensation of a single input signal is performed in first to fourth intervals, and wherein logic values of the first and second control signals are determined in the first to fourth intervals.

2. The offset compensator in a differential amplifier circuit of claim 1, wherein offset detection and compensation is individually performed for each input voltage.

3. The offset compensator in a differential amplifier circuit of claim 1, wherein the first switch is directly connected between the input stage and the capacitor.

4. The offset compensator in a differential amplifier circuit of claim 3, wherein the logic values of the first and second controls are respectively, logic 0 and logic 1 in the first interval, the logic values of the first and second controls are logic 0 in the second interval, the logic values of the first and second controls are respectively, logic 1 and logic 0 in the third interval, and the logic values of the first and second controls are logic 0 in the fourth interval.

5. The offset compensator in a differential amplifier circuit of claim 1, wherein the first to third switches are transistors.

6. The offset compensator in a differential amplifier circuit of claim 1, wherein the differential amplifier circuit is a buffer.

7. The offset compensator in a differential amplifier circuit of claim 1, comprising:
    an additional output stage for connection to a load, wherein the additional output stage generates a second output voltage; and
    a fourth switch coupled between the output stage and the additional output stage, wherein the fourth switch is controlled by the first control signal and selectively generates the second output voltage by selectively coupling the output stage to the load.

8. A differential amplifier circuit, comprising:
    an input stage that receives an input voltage;
    a differential amplifier that has a non-inversion input terminal, an inversion input terminal and a first output stage, wherein the non-inversion and inversion input terminals receive a differential input voltage and the first output stage generates a first output voltage in accordance with the differential input voltage;
    a second output stage for connection to a load, wherein the second output stage generates a second output voltage;
    a storage device coupled to the non-inversion input terminal;
    a first switch coupled between the input stage and the storage device, wherein the first switch is controlled by a first control signal and selectively transfers the input voltage to the storage device;
    a second switch coupled between the input stage and the non-inversion input terminal, wherein the second switch is controlled by a second control signal and selectively transfers the input voltage to the non-inversion input terminal;
    a third switch coupled between the first output stage and the storage device, wherein the third switch is controlled by the second control signal and selectively transfers the first output voltage to the storage device; and
    a fourth switch coupled between the first output stage and the second output stage, wherein the fourth switch is controlled by the first control signal and selectively generates the second output voltage by selectively coupling the first output stage to the load.

9. The differential amplifier circuit of claim 8, wherein offset detection and compensation is individually performed for each input signal of a plurality of input signals.

10. The differential amplifier circuit of claim 8, wherein offset detection and compensation of a single input signal is accomplished in a period consisting of first to fourth intervals, and wherein logic values of the first and second control signals are separately determined in the first to fourth intervals.

11. The differential amplifier circuit of claim 10, wherein the logic values of the first and second controls are respectively logic 0 and logic 1 in the first interval, the logic values of the first and second controls are logic 0 in the second interval, the logic values of the first and second controls are respectively logic 1 and logic 0 in the third interval, and the logic values of the first and second controls are logic 0 in the fourth interval.

12. The differential amplifier circuit according to claim 8, wherein the first to fourth switches are transistors, wherein the storage device is a capacitor, and wherein the differential amplifier circuit is a buffer.

13. A method for compensating an offset in a differential amplifier, the differential amplifier having an output terminal and a non-inversion input terminal and an inversion input terminal for receiving a differential input voltage, the differential amplifier including a storage device connected at a first end to the non-inversion input terminal, comprising:

forming a first feed-back path between the output terminal and the inversion input terminal;

selectively forming a first input path between an input terminal and a second end of the storage device;

selectively forming a second input path between the input terminal and the non-inversion input terminal;

selectively forming a second feed-back path between the output terminal and the second end the storage device; and selectively forming an output path between a load and the output terminal, wherein offset compensation is performed for each differential input voltage received by the differential amplifier.

14. The method for compensating an offset in a differential amplifier of claim 13, comprising:

forming the second input path and the second feed-back paths to output a first output voltage that results from adding an offset voltage of the differential amplifier to a first differential input voltage received at the input terminal, and storing an offset voltage that is a voltage difference between an output voltage and the first differential input voltage in the storage device;

interrupting the second feed-back path and the second input path;

forming the first input path and the output path to input a voltage to the non-inversion input terminal that results from cancellation of the offset voltage from the first differential input voltage by transferring the first differential input voltage to the storage device through the first input path and outputting a first output voltage to the load; and interrupting the first input path and the output path.

15. The method for compensating an offset in a differential amplifier of claim 13, wherein the first input path directly connects the input terminal to the storage device, wherein the second input path directly connects the input terminal to the non-inversion input terminal, wherein the first feed-back path transfers the first output voltage to the inversion input terminal, and wherein the second feed-back path transfers the first output voltage to the storage device.

16. The method for compensating an offset in a differential amplifier of claim 13, wherein the output path includes an output transistor receiving the first control signal at a gate electrode, and wherein the load is a load capacitor coupled between the output transistor and a reference voltage.

17. The method for compensating an offset in a differential amplifier of claim 13, wherein offset detection and compensation of a single input signal is performed in first to fourth intervals, and wherein logic values of the first and second control signals are determined in the first to fourth intervals.

18. The method for compensating an offset in a differential amplifier of claim 17, wherein the logic values of the first and second controls are respectively, logic 0 and logic 1 in the first interval, the logic values of the first and second controls are logic 0 in the second interval, the logic values of the first and second controls are respectively, logic 1 and logic 0 in the third interval, and the logic values of the first and second controls are logic 0 in the fourth interval.

19. The method for compensating an offset in a differential amplifier of claim 13, wherein the storage device is a capacitor.

* * * * *